(12) United States Patent
Paponneau

(10) Patent No.: US 9,654,052 B2
(45) Date of Patent: May 16, 2017

(54) METHOD FOR INSTALLING A SOLAR STRUCTURE IN AN AREA ON THE GROUND

(71) Applicant: Exosun, Martillac (FR)

(72) Inventor: François Paponneau, Cestas (FR)

(73) Assignee: EXOSUN, Martillac (FR)

(*) Notice: Subject to any disclaimer, the term of this patent is extended or adjusted under 35 U.S.C. 154(b) by 21 days.

(21) Appl. No.: 14/408,790

(22) PCT Filed: May 3, 2013

(86) PCT No.: PCT/FR2013/050995
§ 371 (c)(1),
(2) Date: Dec. 17, 2014

(87) PCT Pub. No.: WO2013/190195
PCT Pub. Date: Dec. 27, 2013

(65) Prior Publication Data
US 2015/0288325 A1 Oct. 8, 2015

(30) Foreign Application Priority Data

Jun. 22, 2012 (FR) .................................. 12 55956

(51) Int. Cl.
*H02S 20/32* (2014.01)
*F24J 2/52* (2006.01)
*H01L 31/18* (2006.01)

(52) U.S. Cl.
CPC ............... *H02S 20/32* (2014.12); *F24J 2/526* (2013.01); *F24J 2/5232* (2013.01); *F24J 2/5264* (2013.01); *H01L 31/18* (2013.01); *F24J 2002/529* (2013.01); *F24J 2002/5281* (2013.01); *Y02E 10/47* (2013.01); *Y10T 29/49355* (2015.01)

(58) Field of Classification Search
CPC .................. H01L 31/18; F24J 2002/529; F24J 2002/5281; F24J 2/526; F24J 2/5232; F24J 2/5264; H02S 20/32
See application file for complete search history.

(56) References Cited

U.S. PATENT DOCUMENTS

| 8,671,930 B2 | 3/2014 | Liao |
| 2010/0199972 A1 | 8/2010 | Brost |
| 2011/0186040 A1 | 8/2011 | Liao |
| 2012/0152311 A1* | 6/2012 | Miller ................ G01S 3/7861 136/246 |

FOREIGN PATENT DOCUMENTS

| DE | 10 2010 024 546 | 12/2011 |
| WO | WO 2010/083292 | 7/2010 |

OTHER PUBLICATIONS

PCT/FR2013/0509965 International Search Report dated Aug. 6, 2013 (4 pages).

* cited by examiner

*Primary Examiner* — Moshe Wilensky
(74) *Attorney, Agent, or Firm* — Brinks Gilson & Lione; G. Peter Nichols

(57) ABSTRACT

A method for installing a solar structure includes the steps of: a) planting at least two anchoring feet in an area on the ground (S); b) arranging a pivot support having a pivot axis (X) on the free end that extends above the area of ground of each of the anchoring feet; c) aligning the pivot axes of the pivot supports with each other; d) attaching the pivot supports to the respective anchoring foot thereof; and e) positioning the solar structure on the pivot supports.

5 Claims, 3 Drawing Sheets

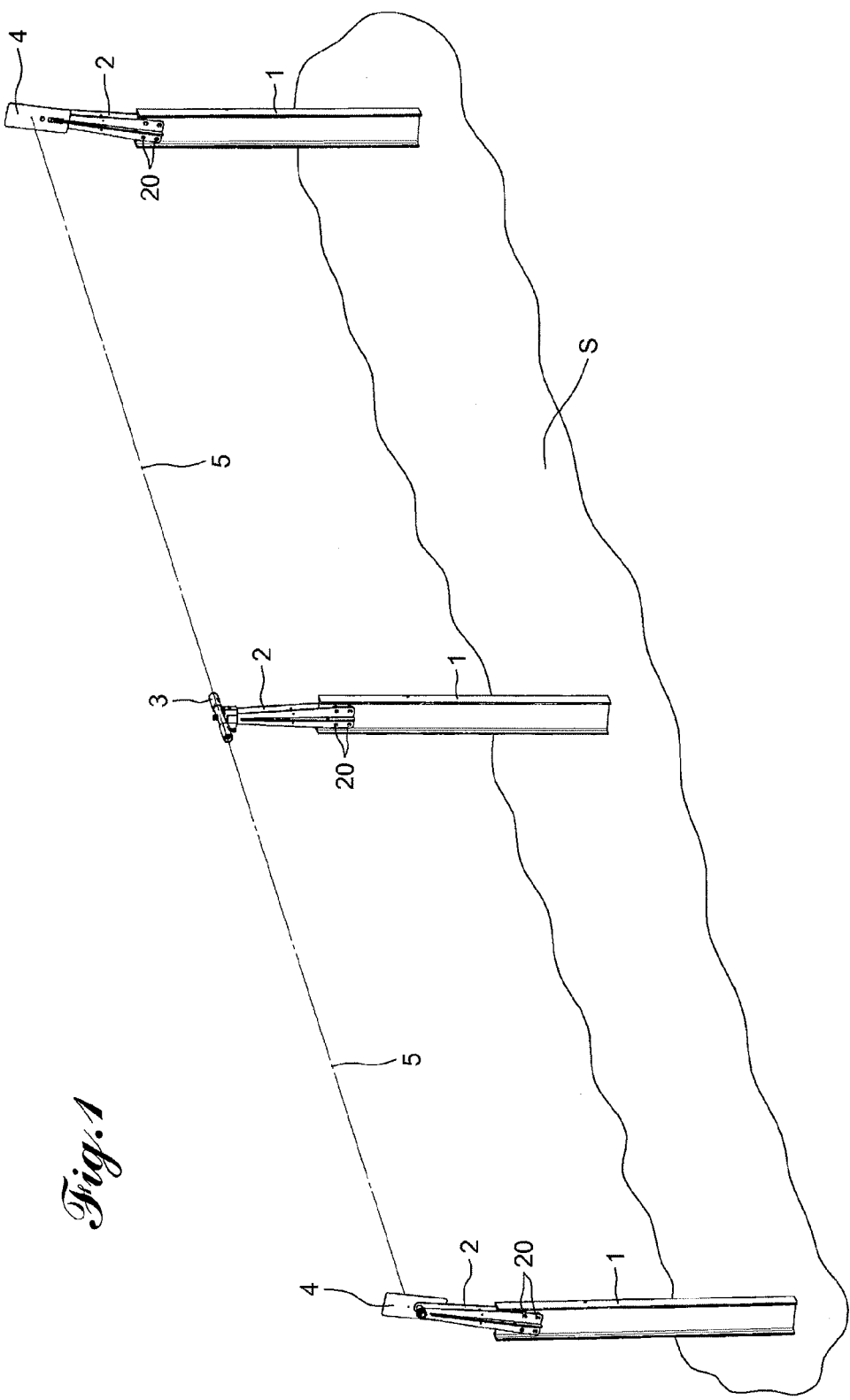

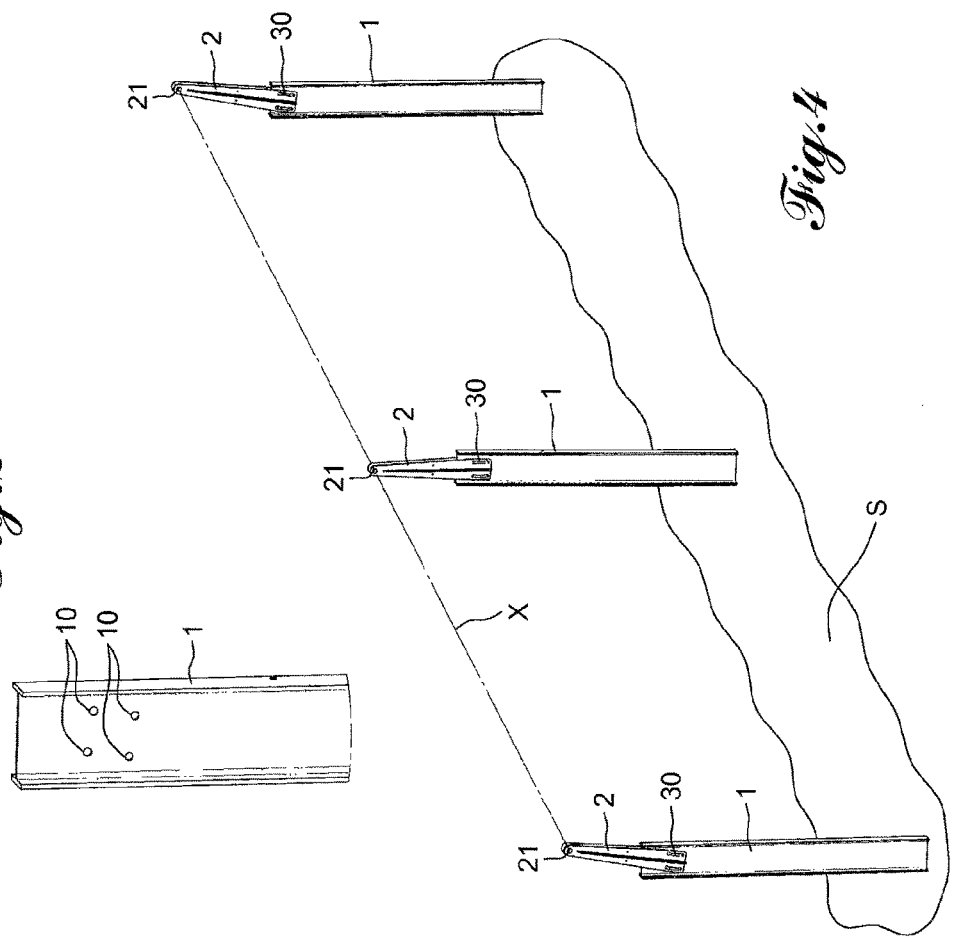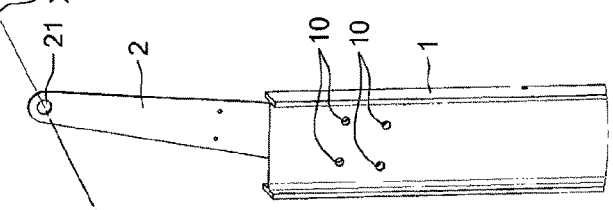

METHOD FOR INSTALLING A SOLAR STRUCTURE IN AN AREA ON THE GROUND

This application claims priority to International Application No. PCT/FR2013/050995 filed May 3, 2013 and to French Application No. 12 55 956 filed Jun. 22, 2012; the entire contents of each are incorporated herein by reference.

BACKGROUND

The invention concerns a method of installing a solar structure, in particular a structure supporting a solar tracker, i.e. the orientation of which changes as a function of the variation of solar illumination during the day, even during the year.

SUMMARY

A prior art solar structure, shown in FIG. 5, for example, commonly includes a support framework 60 able to receive one or more elements 61 for processing solar radiation, for example a plurality of photovoltaic cells. The solar radiation processing elements 61 may be mounted on the framework 60 in a fixed manner. On the other hand, the framework 60 is mounted so as to be rotatable on a set of anchor posts 1, themselves implanted in a line in a portion S of ground, with the aid of pivot supports 2. The solar structure is oriented with the aid of an actuator system 63, 64 that enables control of the general inclination of the framework 60 and therefore of the solar radiation processing elements 61 relative to the ground or to the ground portion S. Here the support framework 60 is mounted so as to be rotatable on three anchor posts 1. This is why it is important for the solar structure to be perfectly installed in the correct position so that control of the general inclination of the support framework 60 and therefore of the solar radiation processing elements 61 is not falsified by incorrect positioning of said support framework 60.

At present, in order to be able to align the pivot axes of the pivot supports 2 at the free end of the anchor posts 1 perfectly with one another, holes are made in the ground portion S in order to be able to embed part of the anchor posts 1 therein. Staying devices are positioned at each of the anchor posts and adjusted so as to align them before pouring concrete into the holes in order to retain the posts in their definitive aligned position. However, such a method has a two-fold disadvantage:

on the one hand, a first disadvantage of being slow to carry out because of the placing of the staying devices on each of the anchor posts 1 and, on the other hand, the fact of using concrete that necessitates an adequate drying time that is relatively long in order to set correctly;

the second disadvantage stemming from the concrete itself, which has a high mass per unit volume and rheological characteristics that make it rather viscous. Because of this, the pouring step leads to problems of destabilization of the anchor posts 1 in their aligned position despite the staying devices. Consequently, after the mass of concrete dries, the support framework 60 can be installed on the pivot supports 2 only with difficulty or with incorrect positioning that can cause inclination errors in the control of the solar structure, which causes degraded efficiency of the solar radiation processing elements 61 supported by the support framework 60.

An object of the invention is to provide a method of installing a solar structure that is simple and fast to carry out whilst ensuring optimum positioning and above all alignment of the pivot supports intended to receive the support framework of the solar radiation processing elements.

To this end, there is provided in accordance with the invention a method of installing a solar structure including steps of:

a) implanting at least two anchor posts on a ground portion in an aligned position;
b) placing a pivot support having a pivot axis at a free end of each of the anchor posts above the ground portion;
c) aligning the pivot axes of the pivot supports with one another in a predetermined direction;
d) fixing the pivot supports to their respective anchor post; and
e) placing the solar structure on the pivot supports.

Therefore, by aligning the pivot axes of the pivot supports that are installed at the free ends of the anchor posts previously positioned so as to be approximately aligned makes it possible to orient said pivot supports before fixing them in order to compensate defects in the alignment of the anchor posts in a simple, fast and low-cost manner.

The installation method in accordance with the invention advantageously but optionally further includes at least one of the following features:

the step of aligning the pivot axes is effected by means of tools including a laser emitter and a set of targets;

the step of fixing the pivot supports is effected by screwing on the pivot supports;

the method includes before the screwing step a step of drilling fixing orifices in the anchor posts;

the fixing orifices are drilled concomitantly in the pivot supports;

the pivot supports including fixing orifices, the method includes before the drilling step steps of:

marking an aligned position of the pivot supports on their respective anchor posts through the fixing orifices of the pivot supports, and removing the pivot supports from their respective anchor posts;

the method includes after the drilling step a step of mounting the pivot supports on their respective anchor post using fixing orifices drilled beforehand;

the method includes before the screwing step a step of checking the alignment of the pivot axes of the pivot supports; and the step of fixing the pivot supports is effected by welding.

BRIEF DESCRIPTION OF THE DRAWINGS

Other features and advantages of the invention will become apparent in the course of the following description of a preferred embodiment of the invention. In the appended drawings:

FIG. 1 is a three-dimensional view showing the step of aligning the pivot axes of the pivot supports using a method in accordance with the invention;

FIG. 2 is a three-dimensional view of a free end of an anchor post after producing fixing orifices following the alignment step of the method in accordance with the invention;

FIG. 3 is a three-dimensional view similar to FIG. 2 in which a pivot support 2 has been mounted on the anchor post following the production of the fixing orifices by the method in accordance with the invention;

FIG. 4 is a three dimensional view of all the pivot supports fixed to their respective anchor posts just before placement of the solar structure by the method in accordance with the invention.

DETAILED DESCRIPTION

Figure 5:
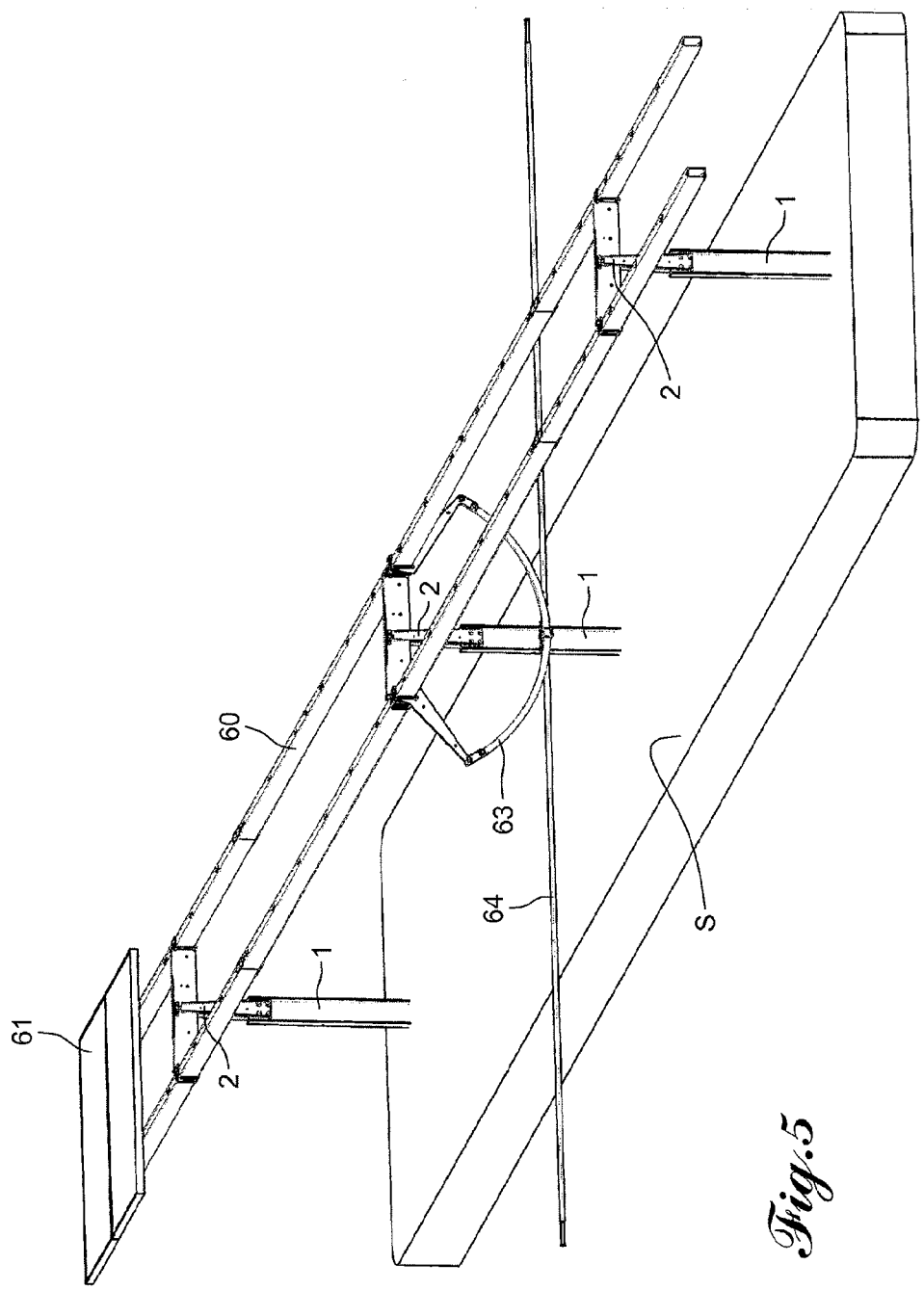
FIG. 5 is a three dimensional view of a solar structure installed using the method in accordance with the invention.

The first steps of a method in accordance with the invention of installing a solar structure will be described with reference to FIG. 1. In a first step, a series of anchor posts 1 are placed substantially vertically and substantially aligned in a predetermined direction on a ground portion S. The anchor posts 1 of the series of anchor posts 1 are driven into place. Alternatively, other methods of placing the anchor posts may be used (screwing, setting in concrete, etc.). Once positioned in the ground portion S, each of the anchor posts 1 has a free end above said ground portion S.

In a second step, a pivot support 2 is positioned at the free end of each of the anchor posts 1. The pivot support 2 is loosely fixed to the free end of the anchor post 1, i.e. the pivot support 2 retains a given position if it is not loaded but any loading enables movement of or a change in the position of the pivot support 2 on the free end of the anchor post 1. Such a connection may be effected by simple clamping with the aid of a C-clamp or any other similar tool, such as a system of magnets. It is to be noted that the pivot supports 2 are of elongate shape with a first or lower end wider than an upper end, the lower end being for example provided from the outset with a series of fixing orifices 20, here four in number arranged at the four corners of a rectangle, and the upper end including an orifice 21 the axis of which defines a pivot axis X of the pivot support 2. In an alternative embodiment, the pivot support 2 is replaced by a jig simulating the pivot support.

In the situation shown in FIG. 1, three anchor posts 1 have been installed in the ground portion S. In a subsequent step a laser emitter 3 is positioned at the upper end of the pivot support 2 so that a laser beam is emitted in a direction perpendicular to a principal plane of the pivot support 2, i.e. in a direction parallel to the pivot axis X of the pivot support 2. Targets 4 are positioned at the upper ends of the other pivot supports 2 installed on the other two anchor posts 1. The targets 4 include a marker which, once the targets have been positioned at the upper end of the pivot support 2, are in the same relative position with respect to the pivot axis X of the pivot support 2 on which the target 4 is installed as the relative position of the laser beam emitted by the laser emitter 3 with respect to the pivot axis X of the pivot support 2 on which said emitter 3 is installed.

In a subsequent step, the pivot supports 2 are positioned so that the pivot axes X of the pivot supports 2 are aligned with one another. To this end, the pivot supports 2 are moved in a suitable manner relative to the free end of the anchor post 1. Alignment is achieved when a laser beam 5 emitted by the laser emitter 3 strikes the marker on each of the targets 4 positioned on either side of the laser emitter 3, as shown in FIG. 1.

Alternatively, a cord may be used to carry out the alignment instead of the laser emitter and the targets.

Thereafter, in a subsequent step, the required alignment having been obtained, fixing orifices 10 are produced in the free end of each of the anchor posts 1 in order to arrive at a result corresponding to that of FIG. 2. The pivot supports 2 including fixing orifices 20 (four in number here), fixing orifices 10 are produced in the free end of each of the anchor posts 1 facing the fixing orifices 20 of the pivot support 2 intended to be received by said anchor post 1. In order to drill the fixing orifices 10 in the anchor post 1, once the foregoing alignment has been obtained, the position of the fixing orifices 10 to be produced is marked by means of a centre-punch, for example through the fixing orifices 20 of the associated pivot support 2. The pivot support 2 is then removed and the fixing orifices 20 are drilled. In an alternative embodiment, the fixing orifices 10 of the anchor post 1 are drilled directly through the fixing orifices 20 of the associated pivot support 2 held in position following the alignment procedure described above.

Once drilling has been carried out, the pivot supports 2 are rigidly, even definitively, fixed in position at the free end of their respective anchor post 1. To this end, fixing means are introduced into each of the fixing orifices 20 of the pivot support 2 and the fixing orifices 10 of the corresponding anchor post 1. These fixing means may be screws or bolts or rivets that are firmly tightened during a final step after the alignment previously produced has been checked again. Once the final tightening has been done, the pivot supports 2 have their pivot axes X aligned with one another along a common axis, as shown in FIG. 4.

Alternatively, in order to avoid checking the alignment again, the fixing means are adapted to fit the fixing orifices 10, 20, thus ensuring repositioning of the pivot supports 2 on their respective anchor post 1 in exactly the same way as positioning them to drill the fixing orifices.

It then remains only to mount the solar structure on the pivot supports 2 as shown in FIG. 5.

In a first alternative embodiment, the pivot supports 2 do not include at their lower end fixing orifices 10 produced beforehand. In this case, once the alignment procedure described above has been carried out, the fixing orifices 20 of the pivot support 2 and the fixing orifices 10 of the anchor post 1 are produced simultaneously by drilling the lower end of the pivot support 2 and the free end of the anchor post 1.

In another alternative embodiment, instead of the fixing orifices 10 and 20 and the use of fixing means passing through these fixing orifices 10 and 20, the lower end of the pivot support 2 in position after the alignment procedure described above has been carried out is welded to the free end of the anchor post 1.

The use of a method in accordance with the invention of installing a solar structure as just described has the advantage of allowing very wide tolerances in respect of the implantation of the anchor posts 1 in the ground portion S whilst remaining very accurate in terms of the alignment of the pivot axes X of the various pivot supports 2 installed at the free end of each of the anchor posts 1. Finally, the use of a method in accordance with the invention of installing a solar structure enables such alignment over a series comprising two or more anchor posts 1 without there being any limitation on the number of anchor posts 1 receiving a pivot support 2 in this manner.

Of course, it is possible to make numerous modifications to the invention without departing from the scope thereof.

The invention claimed is:

1. A method of installing a solar structure comprising, sequentially:

implanting at least two anchor posts on a ground portion in an aligned position;

placing a pivot support having a pivot axis (X) at a free end of each of the anchor posts above the ground portion;

aligning each pivot axis (X) of each pivot support with one another in a predetermined direction;

fixing each pivot support to a respective anchor post, wherein the fixing step includes a step of drilling fixing orifices in the anchor posts followed by a step of screwing on the pivot supports; and placing the solar structure on the pivot supports.

2. The method of claim 1, wherein the step of aligning the pivot axes is performed with a laser emitter and a set of targets.

3. The method of claim 1, wherein the fixing orifices are drilled concomitantly in the pivot supports.

4. The method of claim 1, wherein the pivot supports include fixing orifices and the method includes, before the drilling step:

marking an aligned position of the pivot supports on their respective anchor posts through the fixing orifices of the pivot supports, and removing the pivot supports from their respective anchor posts.

5. The method of claim 1, wherein the method includes, before the screwing step, checking the alignment of each pivot axis of each pivot support.

\* \* \* \* \*